(12) United States Patent
Seki

(10) Patent No.: US 9,939,469 B2
(45) Date of Patent: Apr. 10, 2018

(54) CURRENT MEASURING APPARATUS, IMAGE FORMING APPARATUS, CONVEYANCE APPARATUS AND METHOD FOR MEASURING CURRENT

(71) Applicant: Takeo Seki, Kanagawa (JP)

(72) Inventor: Takeo Seki, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 96 days.

(21) Appl. No.: 15/063,093

(22) Filed: Mar. 7, 2016

(65) Prior Publication Data
US 2016/0274152 A1  Sep. 22, 2016

(30) Foreign Application Priority Data

Mar. 20, 2015 (JP) ................................ 2015-057341

(51) Int. Cl.
*G01R 1/30* (2006.01)
*G01R 19/00* (2006.01)
(Continued)

(52) U.S. Cl.
CPC ................ *G01R 19/25* (2013.01); *H02P 6/00* (2013.01); *G01R 31/343* (2013.01)

(58) Field of Classification Search
CPC .. G01R 31/343; G01R 19/0092; G01R 31/34; G01R 15/146; G01R 19/25; H02P 21/20; H02P 23/14; H02P 6/08; H02P 21/18; H02P 21/22; H02P 6/04; H02P 6/182; H02P 8/38; H02P 21/141; H02P 21/24; H02P 2201/09; H02P 2203/09; H02P 2205/05; H02P 25/145; H02P 27/04; H02P 27/08; H02P 27/085; H02P 29/0241; H02P 29/027; H02P 4/00; H02P 6/00; H02P 6/06; H02P 6/10;
(Continued)

(56) References Cited

U.S. PATENT DOCUMENTS 4,772,830 A * 9/1988 Kobari ................... H02P 25/03
264/40.3
8,844,378 B2   9/2014 Nishikawa
(Continued)

FOREIGN PATENT DOCUMENTS

JP    S58-064506    4/1983
JP    H05-003698    1/1993
(Continued)

*Primary Examiner* — Vinh Nguyen
(74) *Attorney, Agent, or Firm* — Harness, Dickey & Pierce, P.L.C.

(57) ABSTRACT

There is provided a current measuring apparatus for measuring a first current used for estimating a load torque of the motor. The current measuring apparatus may include a detection unit configured to detect a first voltage, an amplification unit including a first input terminal at which the second signal is input, a second input terminal coupled to a first resistor and a second resistor by which an amplification factor is defined, and an output terminal for outputting a third signal, an input unit configured to input a second voltage at the first input terminal, a storage unit configured to store a third voltage an acquisition unit configured to acquire a fourth voltage, and a calculation unit configured to calculate the first current based on a difference between the third voltage and the fourth voltage.

15 Claims, 14 Drawing Sheets

(51) Int. Cl.
*G01R 19/25* (2006.01)
*H02P 6/00* (2016.01)
*G01R 31/34* (2006.01)

(58) Field of Classification Search
CPC .... H02P 6/18; H02P 6/188; H02P 7/00; H02P 7/0094; H02P 7/06; H02P 8/12; H02P 8/14; H02P 8/34; H02P 9/04; H02P 9/10; G01P 3/44; G01P 3/48; H02M 1/12; H02M 1/4225; H02M 1/44; H02M 7/53875; H02N 11/006
See application file for complete search history.

(56) References Cited

U.S. PATENT DOCUMENTS

| | | | |
|---|---|---|---|
| 2005/0275362 A1* | 12/2005 | Yamamoto | H02P 23/26 318/400.18 |
| 2009/0108784 A1* | 4/2009 | Sakamoto | H02P 6/182 318/400.34 |
| 2015/0077027 A1 | 3/2015 | Seki et al. | |
| 2015/0077028 A1 | 3/2015 | Seki et al. | |
| 2016/0248360 A1* | 8/2016 | Seki | H02P 23/14 |

FOREIGN PATENT DOCUMENTS

| | | |
|---|---|---|
| JP | H05-236784 | 9/1993 |
| JP | 2012-162327 | 8/2012 |
| JP | 5331572 | 10/2013 |

\* cited by examiner

CURRENT MEASURING APPARATUS, IMAGE FORMING APPARATUS, CONVEYANCE APPARATUS AND METHOD FOR MEASURING CURRENT

BACKGROUND OF THE INVENTION

1. Field of the Invention

The present disclosure relates to current measuring apparatuses, image forming apparatuses, conveyance apparatuses and methods for measuring current.

2. Description of the Related Art

Conventionally, an amplifier for amplifying an input signal, such as an operational amplifier, is known.

Also, the following method is known. That is, in a combination of a first operational amplifier and a second operational amplifier, a feedback resister is coupled to a feedback section of the first operational amplifier while an input resistor is coupled to an inverted input terminal of the first operational amplifier. Also, a non-inverted input terminal of the second operational amplifier is grounded while an output terminal of the second operational amplifier is coupled to the input resistor. It is known that an input offset can be prevented from being amplified according to a gain without detecting the input offset by using the non-inverted amplifier circuit as described above (for example, Patent Document 1, etc.).

However, in the conventional technology, two operational amplifiers are required in order to measure current. Therefore, in the conventional technology, cost for measuring the current flowing in a motor may be increased.

RELATED ART DOCUMENT

Patent Document

[Patent Document 1]: Japanese Patent No. 5331572

SUMMARY OF THE INVENTION

An object of disclosure of the present technology is to provide a current measuring apparatus capable of measuring a current flowing in a motor at low cost.

The following is adopted to achieve the object.

In one aspect of the embodiments, there is provided a current measuring apparatus for measuring a first current flowing in a motor, the first current being used for estimating a load torque of the motor, the current measuring apparatus comprising: a detection unit configured to detect a first voltage indicating a second current as a first signal, the second current being composed based on currents of respective phases of the motor; a smoothing unit configured to perform a smoothing operation on the first signal to generate a second signal; an amplification unit including a first input terminal at which the second signal is input, a second input terminal coupled to a first resistor and a second resistor by which an amplification factor is defined, an output terminal for outputting a third signal generated by amplifying the second signal in accordance with the amplification factor, a first power supply terminal that is grounded, and a second power supply terminal coupled to a first power supply; an input unit configured to input a second voltage at the first input terminal; a storage unit configured to store a third voltage indicated by the third signal in response to the motor being stopped; an acquisition unit configured to acquire a fourth voltage indicated by the third signal in response to the motor being rotated; and a calculation unit configured to calculate the first current based on a difference between the third voltage and the fourth voltage.

Other objects, features and advantages of the present invention will become more apparent from the following detailed description when read in conjunction with the accompanying drawings.

DETAILED DESCRIPTION OF THE PREFERRED EMBODIMENTS

Figure 1:
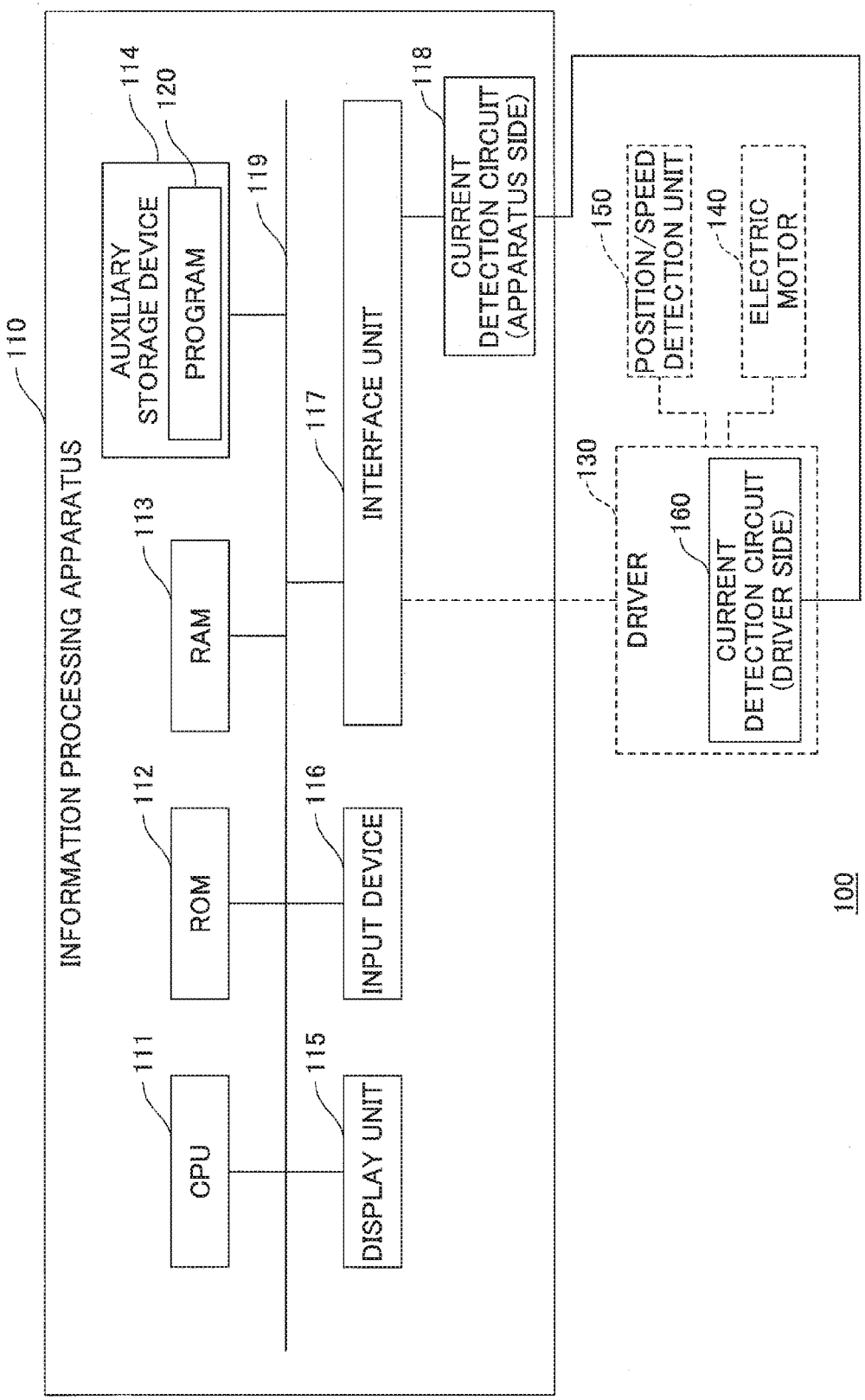
FIG. 1 is a diagram for illustrating an example hardware configuration of a current measuring apparatus of the first embodiment.

In the following, embodiments will be described with reference to accompanying drawings. Additionally, in the embodiments and drawings, identical reference numerals will be applied to elements or the like that have substantially similar functions and configurations to those in another embodiment or another drawing, and descriptions thereof may be omitted.

First Embodiment

Example Current Measuring Apparatus

In the following, an example hardware configuration of a current measuring apparatus of the present embodiment will be described.

FIG. 1 is a diagram for illustrating an example hardware configuration of the current measuring apparatus of the present embodiment.

As shown in FIG. 1, the current measuring apparatus 100 includes an information processing apparatus 110 and a current detection circuit (driver side) 160. Also, the information processing apparatus 110 is coupled to an electric motor 140 and a driver 130 that is coupled to a position/speed detection unit 150, and controls a rotational speed and a rotational position of the electric motor 140 through the driver 130. Further, the information processing apparatus 110 calculates a value of a first current flowing in the electric motor 140.

The driver 130 includes the current detection circuit (driver side) 160, and drives the electric motor 140. Also, the current detection circuit (driver side) 160 detects a composite value composed based on drive current values of respective phases of the electric motor 140.

The information processing apparatus 110 includes a CPU (Central Processing Unit) 111, a ROM (Read-Only Memory) 112, a RAM (Random Access Memory) 113 and an auxiliary storage device 114. Further, the information processing apparatus 110 includes a display unit 115, an input device 116, an interface unit 117, and a current detection circuit (apparatus side) 118. Additionally, the units (CPU 111—interface unit 117) included in the information processing apparatus 110 are connected to each other through a bus 119.

The CPU 111 is a processor as well as a control device for executing a program 120 stored in the auxiliary storage device 114.

The ROM 112 is a non-volatile memory. For example, the ROM 112 serves as a storage device for storing programs, data, etc., required for executing the program 120 by the CPU 111. Specifically, the ROM 112 stores boot programs, etc., such as a BIOS (Basic Input/Output System) and an EFI (Extensible Firmware Interface).

The RAM 113 is a main storage device comprising a DRAM (Dynamic Random Access Memory), a SRAM (Static Random Access Memory) or the like. Also, the RAM 113 provides a work area for executing the program 120 by the CPU 111.

Respective programs are stored in the auxiliary storage device 114. That is, for example, the auxiliary storage device 114 is a hard disk, and the like.

A display unit 115 displays a screen for inputting a target control value (target rotational speed and target rotational position), a screen for showing a detection result (measured value) of the rotational speed of the electric motor 140 and a detection result (measured value) of the rotational position of the electric motor 140. Further, the display unit 115 displays a screen for showing estimated load torque (estimated torque value), and the like.

The input device 116 is an operational member for inputting operations (e.g., operations for inputting target control values) with respect to the information processing apparatus 110, and includes a mouse, a keyboard, and the like.

The interface unit 117 transmits a control value for controlling the electric motor 140 that is an object to be controlled to the driver 130 coupled to the electric motor 140. Also, the interface unit 117 receives information (measured values of rotational speed and rotational position, etc.) indicating a state of the electric motor 140 to be controlled from the position/speed detection unit 150. Further, the current detection circuit (driver side) 160 included in the driver 130 performs a smoothing process on a signal indicating the composite value composed based on the drive current values of the respective phases of the electric motor 140. Then, the information processing apparatus 110 receives an amplified signal through the current detection circuit (apparatus side) 118.

The current detection circuit (apparatus side) 118 removes noise included in the signal transmitted from the current detection circuit (driver side) 160. Also, the current detection circuit (apparatus side) 118 performs A/D conversion, etc., by using an ADC (Analog/Digital converter) to input a signal into the interface unit 117.

The driver 130 drives the electric motor 140 based on a control value transmitted from the interface unit 117. For example, the electric motor 140 is a three-phase brushless motor (DC (Direct-Current) motor), or the like. The electric motor 140 may be another type of motor.

For example, the position/speed detection unit 150 is included in the electric motor 140, and outputs a detection signal (signal indicating rotational speed or signal indicating rotational position). Specifically, the detection signal output from the position/speed detection unit 150 is transmitted as a measured value of the rotational speed or a measured value of the rotational position to the interface unit 117 through the driver 130. Further, in the present embodiment, for example, the position/speed detection unit 150 includes a two-phase encoder, a one-phase photo-detector, and the like. Also, the position/speed detection unit 150 may include a magnetic sensor such as a FG (Frequency Generator) sensor and a Hall element sensor.

For example, the current detection circuit (driver side) 160 is included in the driver 130. Also, the current detection circuit (driver side) 160 includes a low-pass filter, etc., and performs a smoothing process on the signal indicating the composite value composed based on the drive current values of the respective phases of the electric motor 140. Further, the current detection circuit (driver side) 160 includes an operational amplifier, etc., and amplifies the signal. Also, the current detection circuit (driver side) 160 transmits the amplified signal to the current detection circuit (apparatus side) 118 through a harness, and the like. Additionally, a part of or all of the processes performed by the current detection circuit (driver side) 160 may be performed by the current detection circuit (apparatus side) 118.

<Example Functional Configuration>

Figure 2:
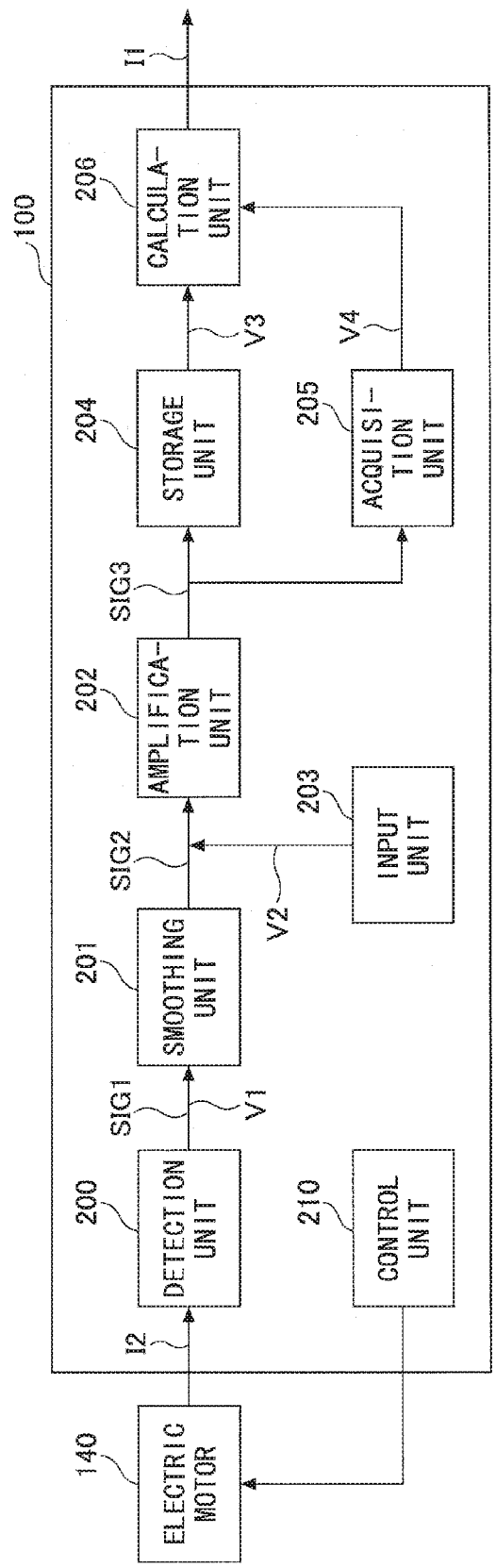
FIG. 2 is a block diagram for illustrating an example functional configuration of the current measuring apparatus of the first embodiment.

FIG. 2 is a block diagram for illustrating an example functional configuration of the current measuring apparatus of the present embodiment. Specifically, the current measuring apparatus 100 includes a detection unit 200, a smoothing unit 201, an amplification unit 202, an input unit 203, a storage unit 204, an acquisition unit 205 and a calculation unit 206.

<Example Detection Unit>

The detection unit 200 detects a first voltage V1 as a first signal SIG1, where a value of a second current I2 composed based on the drive currents of the respective phases of the electric motor 140 is indicated by the first voltage V1.

Figure 3:
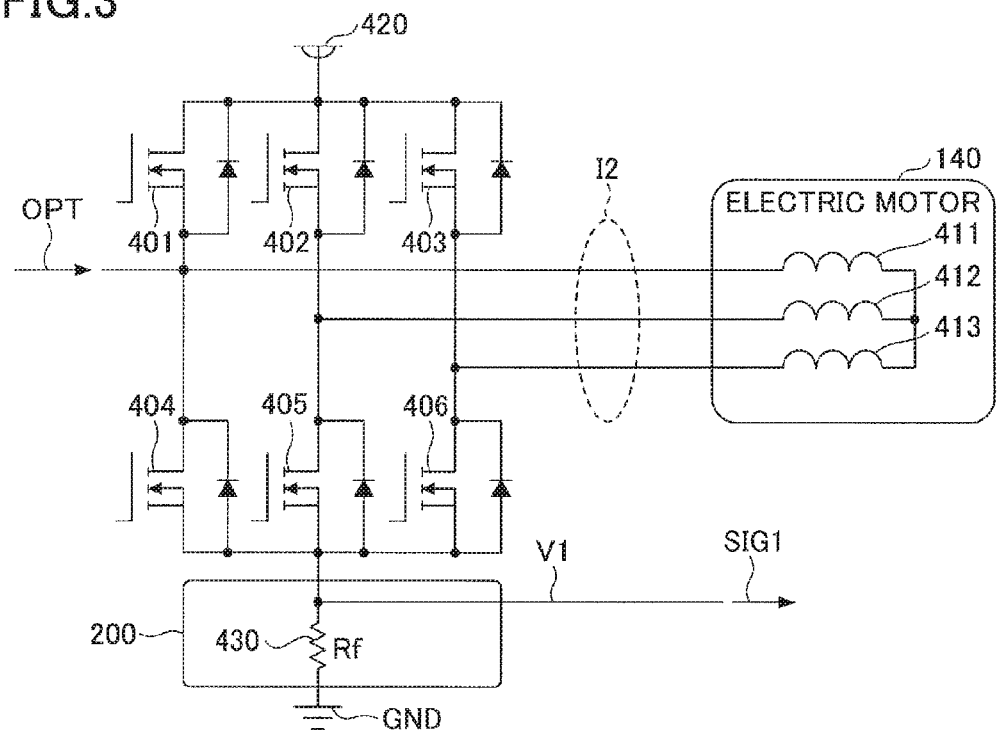
FIG. 3 is a circuit diagram for illustrating an example circuit configuration of a detection unit of the first embodiment.

FIG. 3 is a circuit diagram for illustrating an example circuit configuration of the detection unit 300 of the present embodiment.

For example, the detection unit 200 is achieved by the current detection circuit (driver side) 160 (FIG. 1). Specifically, for example, the detection unit 200 includes a so-called shunt resistor 430, as shown in FIG. 3.

Also, as shown in FIG. 3, the current detection circuit includes transistors 401-406. Specifically, emitter terminals of the transistors 401-403 are respectively coupled to collector terminals of the transistors 404-406.

The drive currents of respective phases of the electric motor 140 respectively flow through a first stator winding 411, a second stator winding 412 and a third stator winding 413, where the second current I2 is composed based on the respective drive currents. As shown in FIG. 3, the first stator winding 411 is coupled to the emitter terminal of the transistor 401 and the collector terminal of the transistor 404. Also, the second stator winding 412 is coupled to the emitter terminal of the transistor 402 and the collector terminal of the transistor 405. Further, the third stator winding 413 is coupled to the emitter terminal of the transistor 403 and the collector terminal of the transistor 406.

Also, the collector terminals of the transistors 401-403 are coupled to a motor power supply 420 for powering the electric motor 140. On the other hand, the emitter terminals of the transistors 404-406 are coupled to the shunt resistor 430.

In FIG. 3, one terminal of the shunt resistor 430 is coupled to transistors 404-406, while the other terminal of the shunt resistor 430 is coupled to ground GND.

Transistors 404-406 are turned on or turned off by an output OPT. That is, whether the drive current flows from the motor power supply 420 can be controlled by the output OPT. Thus, the transistors 401-406 control the drive current to flow in respective phases of the electric motor 140, that is, the transistors 401-406 switch an excitation phase of the electric motor 140 among the respective phases of the electric motor 140 (switch exciting stator winding among the first stator winding 411—third stator winding 413).

The shunt resistor 430 detects the second current I2 composed based on at least one of the currents flowing from the motor power supply 420 through the transistors 401-406. Also, the value of the second current I2 detected by the shunt resistor 430 is indicated by the first voltage V1. That is, for example, the first voltage V1 is a voltage across the shunt resistor, and is input at the current detection circuit (driver side) 160 as the first signal SIG1.

Additionally, the signal indicating the voltage across the shut resistor is in a pulse waveform. Amplitude of the signal indicating the voltage across the shut resistor becomes greater as the load torque increases, while a duty ratio thereof becomes greater as the rotational speed increases. Also, often, the signal indicating the voltage across the shut resistor is a faint signal whose amplitude is approximate tens of mV. Further, the signal indicating the voltage across the shunt resistor may be used for calculating a torque of the electric motor 140.

Additionally, the detection unit 200 may include the shunt resistor 430 in a manner such that one terminal of the shunt resistor 430 is coupled to the motor power supply 420.

Figure 4:
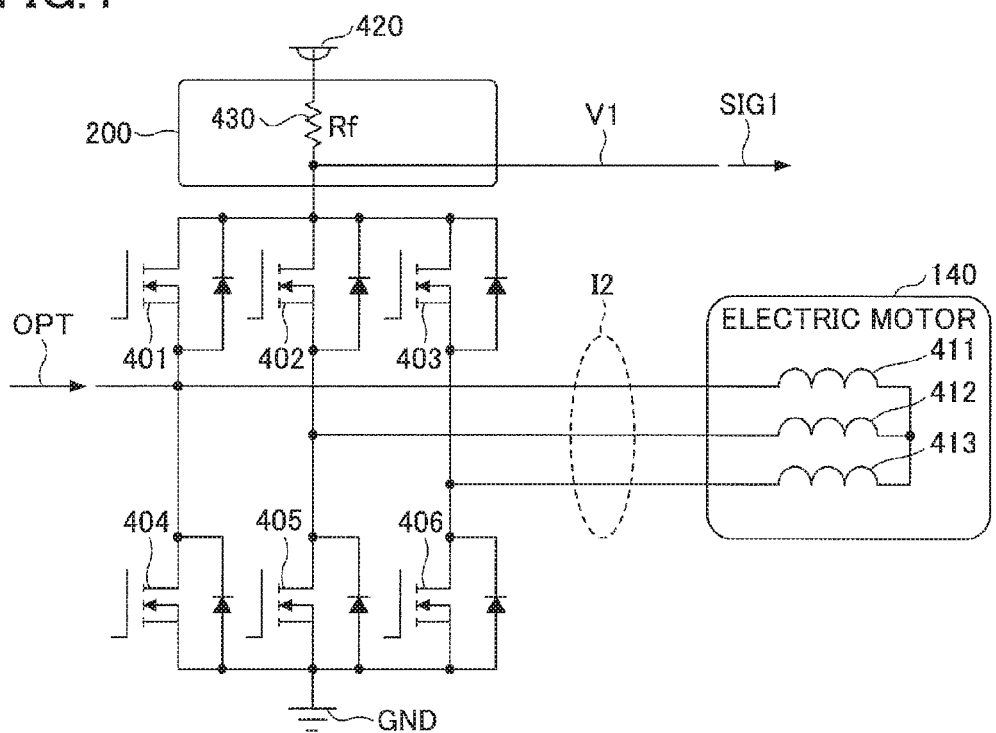
FIG. 4 is a circuit diagram for illustrating another example circuit configuration of the detection unit of the first embodiment.

FIG. 4 is a circuit diagram for illustrating another example circuit configuration of the detection unit of the present embodiment.

In FIG. 4, the arrangement of the shunt resistor 430 is different from that shown in FIG. 3. In the following, mainly, the difference will be described.

In FIG. 4, one terminal of the shunt resistor 430 is coupled to the motor power supply 420. In FIG. 3, the shunt resistor 430 is provided at a ground GND side, which is referred to a low-side detection configuration. On the other hand, in FIG. 4, the shunt resistor 430 is provided at a motor power supply 420 side, which is referred to a high-side detection configuration.

When the detection unit 200 has the low-side detection configuration as shown in FIG. 3, the current detection circuit can be simply designed since the current detection circuit is configured to be a single-ended detection circuit, that is, a simple circuit with a single power supply. Also, when the detection unit 200 has the low-side detection configuration, the current detection circuit can be formed without having a high common mode rejection ratio (CMR) and a high common mode withstanding voltage (CMV).

On the other hand, when the detection unit 200 has the high-side detection configuration, the current detection circuit can be easily coupled to a control circuit, etc., since the current detection circuit can be disposed between a load and the power supply. For example, even assuming that a main part (load) including the control circuit is separated from the power supply, in a case where the detection unit 200 has the high-side detection configuration, the current detection circuit can perform detection operation at the main part of the power supply. Therefore, the detection result can be more easily transmitted to the main part in comparison to a case where the detection unit 200 has the low-side detection configuration.

<Example Detection Result of Detection Unit>

Figure 5:
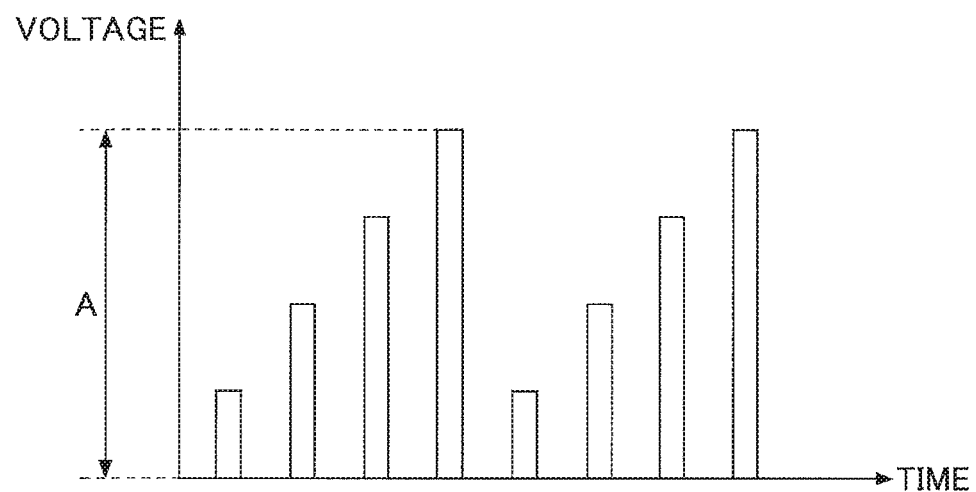
FIG. 5 is a diagram for illustrating an example detection result of the detection unit of the first embodiment.

FIG. 5 is a diagram for illustrating an example detection result of the detection unit of the present embodiment. Specifically, FIG. 5 shows an example of the first voltage V1 detected by the detection unit 200 (FIG. 2). The maximum value "A" of the first voltage V1 shown in FIG. 5 is approximately 100 mV. The first voltage V1 has an offset of approximately ±20 mV.

<Example of Smoothing Unit>

Figure 6:
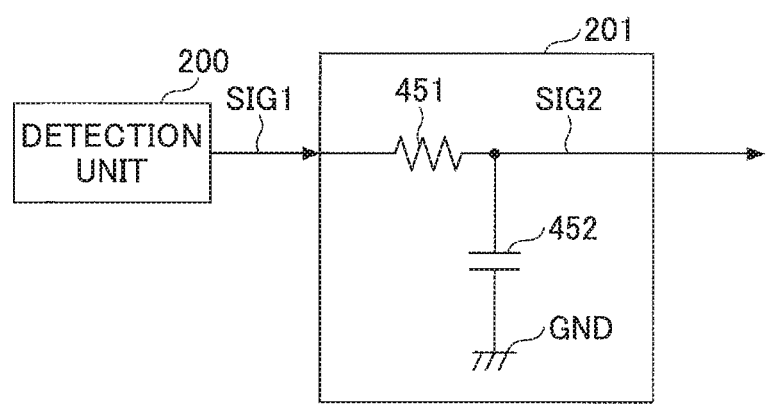
FIG. 6 is a circuit diagram for illustrating an example circuit configuration of a smoothing unit of the first embodiment.

FIG. 6 is a circuit diagram for illustrating an example circuit configuration of the smoothing unit of the present embodiment.

For example, the smoothing unit 201 is achieved by the current detection circuit (driver side) 160 (FIG. 1). Specifically, the smoothing unit 201 includes a resistor 451 that is an example of a third resistor and a capacitor 452, where the resistor 451 and the capacitor 452 are connected as shown in FIG. 6 to achieve a low-pass filter. That is, the resistor 451 includes a fifth terminal and sixth terminal, where the first signal SIG1 is input at the fifth terminal and a second signal SIG2 generated by smoothing the first signal SIG1 is output from the sixth terminal to the amplification unit 202 (FIG. 2).

That is, the smoothing unit 201 filters a signal whose frequency is greater than or equal to a predetermined frequency among the frequencies included in the first signal SIG1 provided from the detection unit 200. Additionally, the frequency of the signal to be attenuated by the smoothing unit 201 is defined in accordance with the resistance of the resistor 451 and the capacitance of the capacitor 452. Therefore, the smoothing unit 201 can attenuate noise included in the first signal SIG1. Then, the smoothing unit 201 outputs the second signal SIG2 by attenuating the noise included in the first signal SIG1.

<Example of Amplification Unit>

Figure 7:
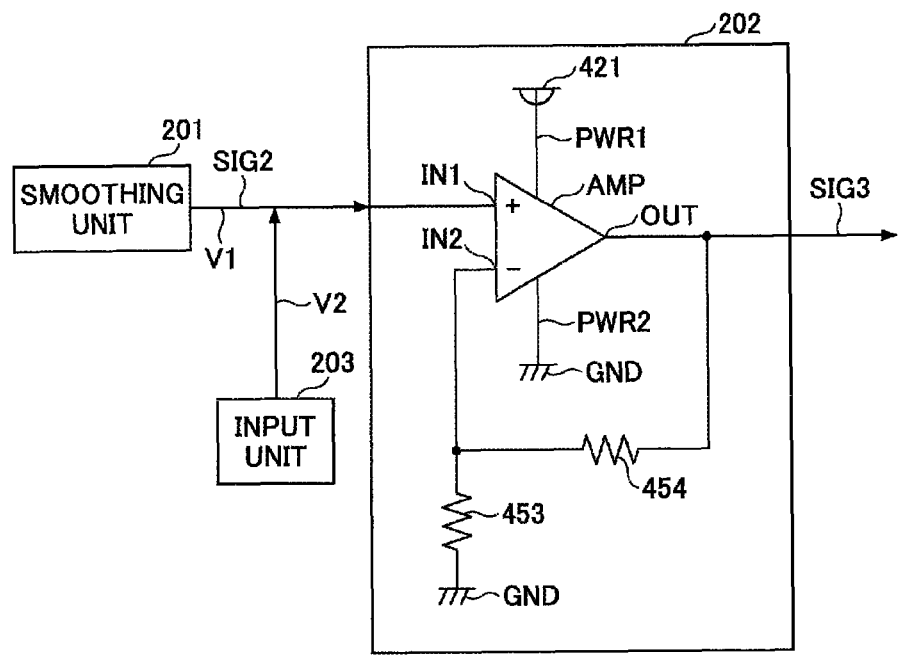
FIG. 7 is a circuit diagram for illustrating an example circuit configuration of an amplification unit of the first embodiment.

FIG. 7 is a diagram for illustrating an example circuit configuration of the amplification unit of the present embodiment.

For example, the amplification unit 202 is achieved by the current detection circuit (driver side) 160 (FIG. 1). The amplification unit 202 includes an operational amplifier AMP. Also, the operational amplifier AMP includes a positive side input terminal IN1 that is an example of a first input terminal, a negative side input terminal IN2 that is an example of a second input terminal, and an output terminal OUT that is an example of an output terminal. Further, the operational amplifier AMP includes a positive side power supply terminal PWR1 coupled to a first power supply 421, which is an example of a second power supply terminal, and a negative side power supply terminal PWR2 coupled to ground GND, which is an example of a first power supply terminal.

That is, the operational amplifier AMP is a single-power amplifier, where a reference voltage of the power supply voltage is the ground GND. Therefore, a third signal SIG3 output from the operational amplifier AMP can vary within a range between 0 V at ground GND and the power supply voltage of the first power supply 421.

Also, for example, the power supply voltage of the first power supply 421 is +5 V, or the like. Additionally, the power supply voltage of the first power supply 421 is defined in accordance with a specification of the operational amplifier AMP.

Also, the amplification unit 202 includes a resistor 453 that is an example of a first resistor, and a resistor 454 that is an example of a second resistor. Further, one terminal of the resistor 453 and one terminal of resistor 454 are coupled to a negative side input terminal IN2. Further, the other terminal of the resistor 453 is coupled to ground GND, while the other terminal of the resistor 454 is coupled to the output terminal OUT.

A positive side input terminal IN1 is a non-inverted terminal at which the second signal SIG2 provided from the smoothing unit 201 is input. Also, the second voltage V2 provided from the input unit 203 is input at the positive side input terminal IN1. Therefore, the first voltage indicated by the second signal SIG2 is a voltage generated by adding the second voltage V2 to a voltage provided from the smoothing unit 201.

The operational amplifier AMP amplifies the signal input at the positive side input terminal IN1 to generate a third signal SIG3. Additionally, an amplification factor is defined in accordance with resistances of the resistors 453 and 454.

<Example Input Unit>

Figure 8:
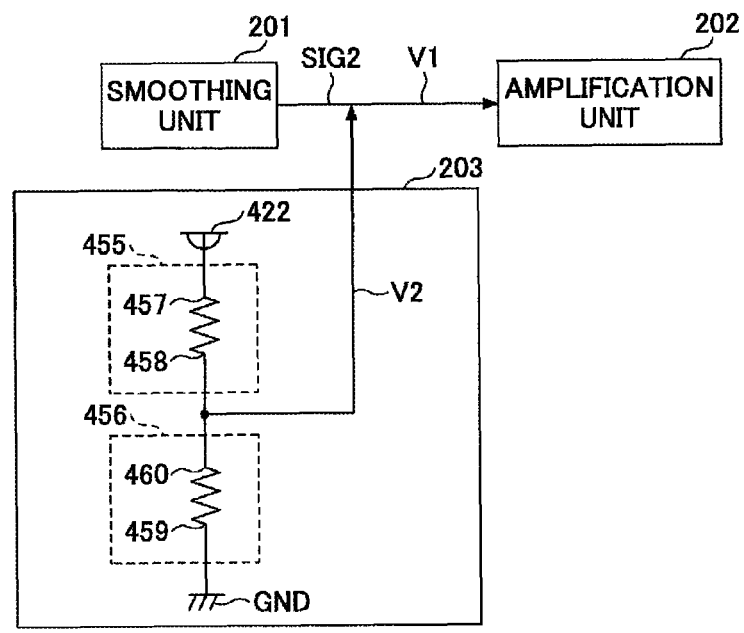
FIG. 8 is a circuit diagram for illustrating an example circuit configuration of an input unit of the first embodiment.

FIG. 8 is a circuit diagram for illustrating an example circuit configuration of the input unit of the present embodiment.

For example, the input unit 203 is achieved by the current detection circuit (driver side) 160 (FIG. 1). Specifically, the input unit 203 includes a resistor 455 that is an example of a fourth resistor and a resistor 456 that is an example of a fifth resistor. Also, the resistor 455 includes a first terminal 457 coupled to a second power supply 422, and a second terminal 458 coupled to a positive input terminal IN1 (FIG. 7) of the amplification unit 202. Meanwhile, the resistor 456 includes a third terminal 459 coupled to ground GND, and a fourth terminal 460 coupled to the positive input terminal IN1 of the amplification unit 202.

The input unit 203 provides a second voltage V2 at the positive input terminal IN1, where the second voltage V2 is generated by dividing the power supply voltage of the second power supply 422 with the resistor 455 and the resistor 456.

Additionally, the second power supply 422 may be the same power supply as the first power supply 421 (FIG. 7). That is, the second power supply 422 and the first power supply 421 may supply the power of the same power supply. When the second power supply 422 is the same power supply as the first power supply 421, a size of an electronic circuit substrate can be reduced since types of the power supplies can be reduced.

<Example of Storage Unit, Acquisition Unit and Calculation Unit>

Figure 9:
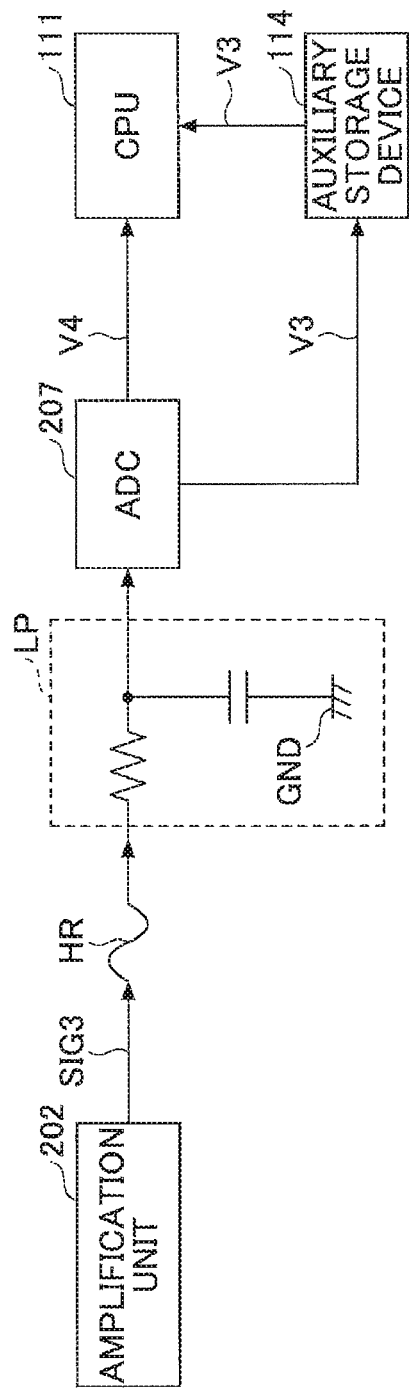
FIG. 9 is a circuit diagram for illustrating an example circuit configuration of a storage unit, an acquisition unit and a calculation unit of the first embodiment.

FIG. 9 is a circuit diagram for illustrating an example circuit configuration of the storage unit, the acquisition unit and the calculation unit. Additionally, for example, the storage unit 204 is achieved by an ADC 207 and an auxiliary storage device 114 included in the current detection circuit (apparatus side) 118 (FIG. 1), and the like. Also, for example, the acquisition unit 205 is achieved by the ADC 207, and the like. Further, for example, the calculation unit 206 is achieved by the CPU 111 and the like.

As shown in FIG. 9, for example, a third signal SIG3 output from the amplification unit 202 is transmitted through a harness HR. Also, the current detection circuit (apparatus side) 118 (FIG. 1) may include a low-pass filter LP, and noise included in the third signal SIG3 may be attenuated by the low-pass filter LP.

The storage unit 204 stores a third voltage V3 indicated by a third signal SIG3 when the electric motor 140 (FIG. 1) is stopped.

The acquisition unit 205 acquires a fourth voltage V4 indicated by the third signal SIG3 when the electric motor 140 is driven. Additionally, the acquisition unit 205 may acquire a plurality of values of the fourth voltage V4 to calculate an average thereof.

Moreover, the third voltage V3 may be obtained as an average of a plurality of values of the third voltage V3. Similarly, the fourth voltage V4 may be obtained as a plurality of values of the fourth voltage V4.

The calculation unit 206 calculates a difference between the third voltage V3 stored in the storage unit 204 and the fourth voltage V4 acquired by the acquisition unit 205. Also, the calculation unit 206 calculates the first current I1 (FIG. 2) based on the third voltage V3 and the fourth voltage V4.

<Descriptions of Block Diagram>

In the following, an example block diagram for illustrating a configuration of an apparatus for controlling the rotational speed and the rotational position of the electric motor 140 and for estimating load torque will be described.

Figure 10:
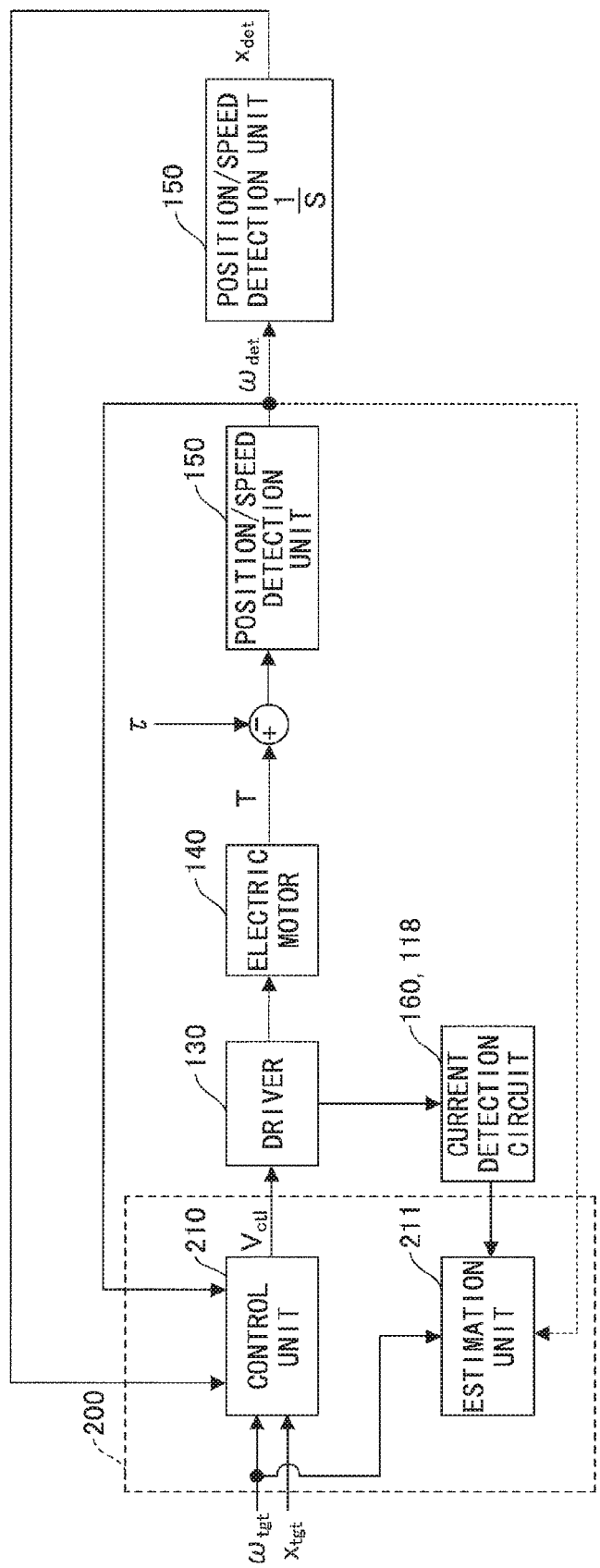
FIG. 10 is a block diagram for illustrating a functional configuration for controlling an electric motor and for estimating load torque.

FIG. 10 is a block diagram for illustrating a configuration of an apparatus for controlling the electric motor 140 and for estimating load torque. As shown in FIG. 10, a control unit 210 outputs a control value (voltage value $V_{ctl}$) based on a control target value (target rotational speed $\omega_{tgt}$ or target rotational position $x_{tgt}$) and a fed-back measured value (measured rotational speed $\omega_{det}$ or measured rotational position $x_{det}$).

The driver 130 has the current flow in respective phases of the electric motor 140 based on the control value (voltage value $V_{ctl}$) output from the control unit 210. Additionally, the second current composed based on drive current values of respective phases of the electric motor 140 is detected by the current detection circuit (driver side) 160 through a shunt resistor included in the driver 130. A signal indicating the detected second current is smoothed and amplified by the current detection circuit (driver side) 160 to be input into an estimation unit 211 through the current detection circuit (apparatus side) 118.

When the drive currents flow in the respective phases of the electric motor 140, a certain rotation torque T is generated to drive the electric motor 140. Meanwhile, the load torque τ is applied to the electric motor 140. Therefore, the motor 140 rotates at a rotational speed corresponding to a difference between the rotation torque T and the load torque τ.

The position/speed detection unit 150 detects the rotational speed of the electric motor 140 and the measured rotational speed $\omega_{det}$ is fed back to the control unit 210.

Or, the rotational position is detected based on the detected rotational speed (or the rotational position may be directly detected), and the rotational position is fed back to the control unit 210 as the measured rotational position $x_{det}$.

As described above, a feedback control based on the measured rotational speed $\omega_{det}$ or measured rotational position $x_{det}$ is performed, thereby controlling the electric motor 140 so as to rotate at the target rotational speed $\omega_{tgt}$ or to reach the target rotational position $x_{tgt}$.

On the other hand, separately from the control of the rotational speed or rotational position of the electric motor 140, the estimation unit 211 may sequentially estimate the load torque. Specifically, when the load torque is calculated based on the target rotational speed $\omega_{tgt}$ or the target rotational position $\omega_{det}$, and the signal indicating a value of the first current I1 provided from the current detection circuit (apparatus side) 118, the estimation unit 211 can estimate the load torque.

Additionally, the control target value (target rotational speed $\omega_{tgt}$ or target rotational position $x_{tgt}$) or the measured value (measured rotational speed $\omega_{det}$ or measured rotational position $x_{det}$) is output in every control cycle of the control unit 210. Therefore, the estimation unit 211 can estimate the load torque in every control cycle of the control unit 210.

<Example General Arrangement of Current Measuring Apparatus>

Figure 11:
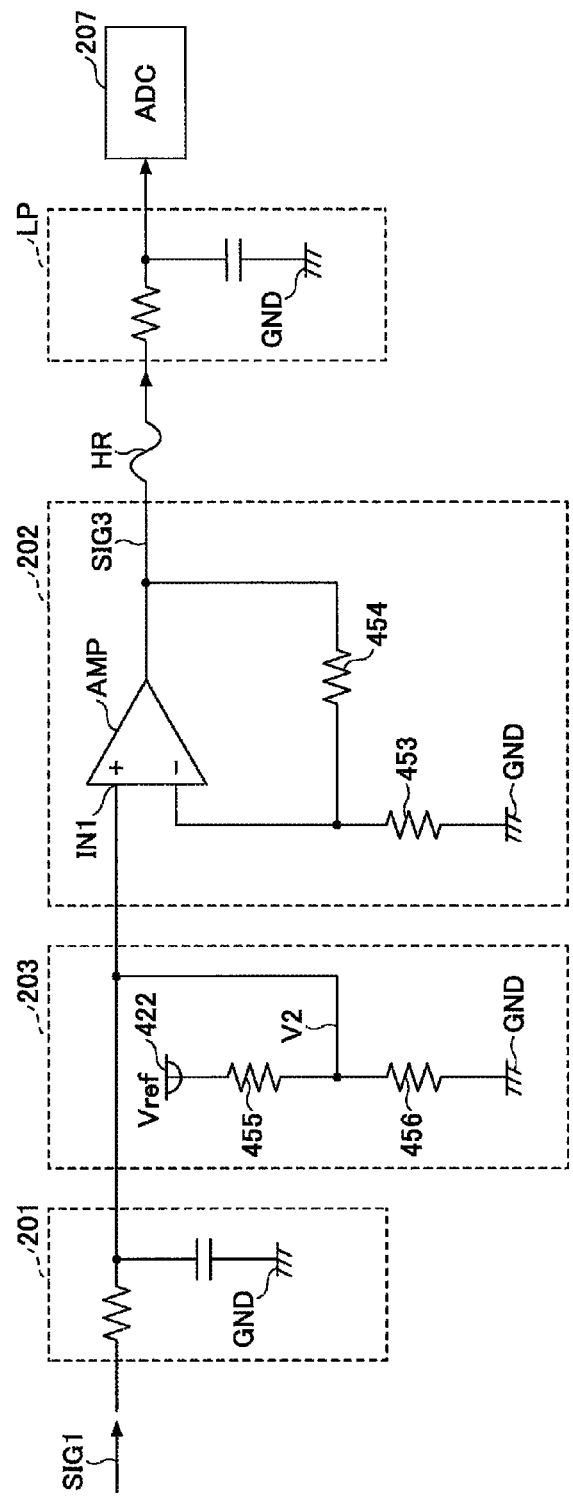
FIG. 11 is a circuit diagram for illustrating a general arrangement of current measuring apparatus of the first embodiment.

FIG. 11 is a circuit diagram for illustrating a general arrangement of the current measuring apparatus of present embodiment.

The first signal SIG1 indicating the first voltage V1 (FIG. 3 or FIG. 4) that is a voltage across the shunt resistor is input into the circuit shown in FIG. 11. Then, the first signal SIG1 is smoothed by the smoothing unit 201, thereby generating the second signal. Further, the second signal is input at the operational amplifier AMP included in the amplification unit 202.

If the operational amplifier needs to amplify the signal that is not smoothed, an expensive operational amplifier with high slew rate and high gain bandwidth (GB) will be required. On the other hand, in the present embodiment, the amplification unit 202 can be achieved with a low-cost operational amplifier since the smoothing unit 201 performs the smoothing operation.

A single-power operational amplifier AMP is unlikely to output a negative output. Specifically, in a case where a signal at a positive input terminal IN1 is "0" and an offset voltage has a positive value, the single-power operational amplifier AMP outputs an output value according to the offset voltage. On the other hand, in a case where the signal at a positive input terminal IN1 is "0" and an offset voltage has a negative value, the single-power operational amplifier AMP outputs "0".

Therefore, in the present embodiment, the input unit 203 provides the second voltage V2 at the positive input terminal IN1. Also, the second voltage V2 is generated by dividing a voltage Vref by the resistor 455 and the resistor 456, where the voltage Vref is the power supply voltage of the second power supply 422.

Also, when the second voltage V2 is provided at the positive input terminal IN1, the voltage at the positive input terminal IN1 is increased by the second voltage V2. Therefore, even if the voltage at the positive input terminal IN1 has a negative value, the input unit 203 can make the voltage at the positive input terminal IN1 have a positive value by adding the second voltage. Hence, when the input unit 203 provides the second voltage V2, the single-power operational amplifier AMP can output a value even if the voltage at the positive input terminal IN1 has a negative value.

Additionally, a preferable second voltage V2 makes the offset voltage (substantially the voltage at the positive input terminal IN1) to be a positive value. Also, the voltage at the positive input terminal IN1 is determined in accordance with a specification of the operational amplifier, and the like. For example, in a case where a voltage between −100 mV and +100 mV is applied at the operational amplifier AMP, the preferable second voltage V2 is greater than or equal to +100 mV. More preferably, the second voltage V2 is approximate +200 mV (doubling +100 mV) in order to include a margin in the second voltage V2. Also, the preferable second voltage V2 is equal to or less than the power supply voltage of the first power supply 421 since the maximum output of the operational amplifier AMP is the power supply voltage of the first power supply 421 (FIG. 7).

The operational amplifier AMP amplifies the voltage at the positive input terminal IN1 at an amplification factor defined in accordance with the resistance values of the resistors 453 and 454 to generate the third signal SIG3, thereby outputting the third signal SIG3 to the ADC 207 through the harness HR. Additionally, noise included in the third signal SIG3 may be attenuated through the low-pass filter LP.

<Example Current Measuring Process>

Figure 12:
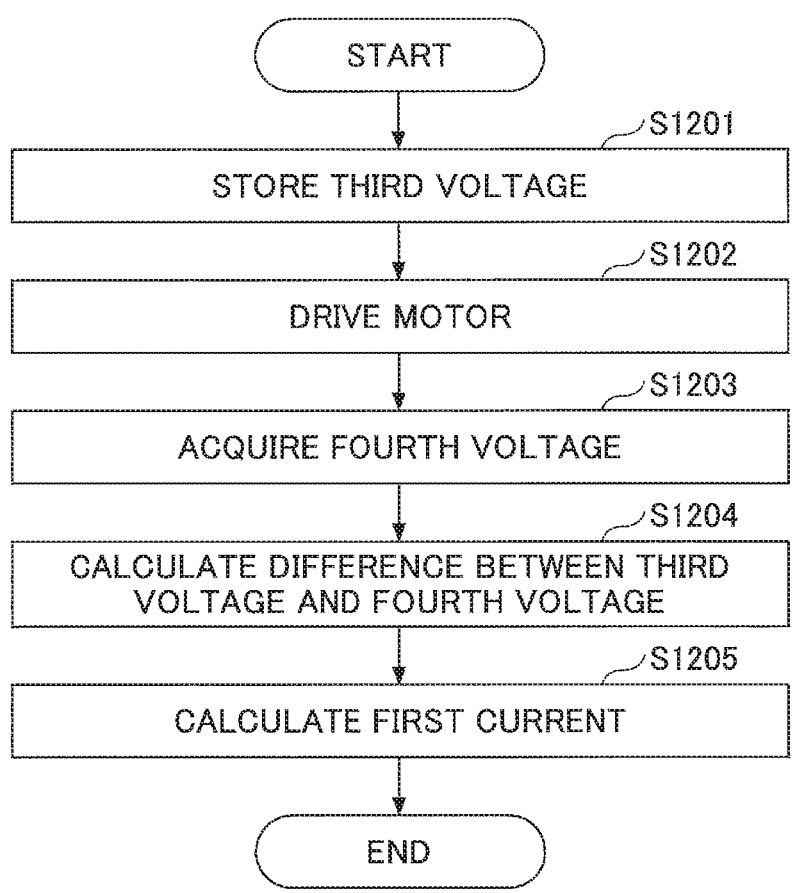
FIG. 12 is a flowchart for illustrating an example current measuring process.

FIG. 12 is a flowchart for illustrating an example current measuring process.

In step S1201, when the electric motor is stopped, the storage unit 204 stores the third voltage V3 (FIG. 9) indicated by the third signal SIG3 (FIG. 11) input in the ADC 207. For example, the storage unit 204 stores the third voltage V3 every time before measuring the load of the electric motor, periodically (e.g. once a day), at factory shipment, and the like.

Also, a state where the electric motor is stopped means a state where the rotation of the electric motor is stopped, a state where a motor brake is applied, a state where the rotational speed is "0" rpm (revolutions per minute), and the like.

In step S1202, the control unit 210 has the electric motor rotate.

In step S1203, when the electric motor is rotating, the acquisition unit 205 acquires the fourth voltage V4 (FIG. 9) indicated by the third signal SIG3 input in the ADC 207. That is, in step S1203, in a case where the load to be measured is applied to the electric motor and the electric motor is rotating at the target rotational speed, the acquisition unit 205 acquires the fourth voltage V4 indicated by the third signal SIG3.

In step S1204, the calculation unit 206 calculates a difference between the third voltage V3 and the fourth voltage V4. That is, the calculation unit 206 calculates a difference between the third voltage V3 stored by the storage unit 204 in step S1201 and the fourth voltage V4 acquired by the acquisition unit 205 in step S1203. The calculation unit 206 can cancel the offset voltage through the calculation.

In step S1205, the calculation unit 206 calculates the first current I1.

Figure 13:
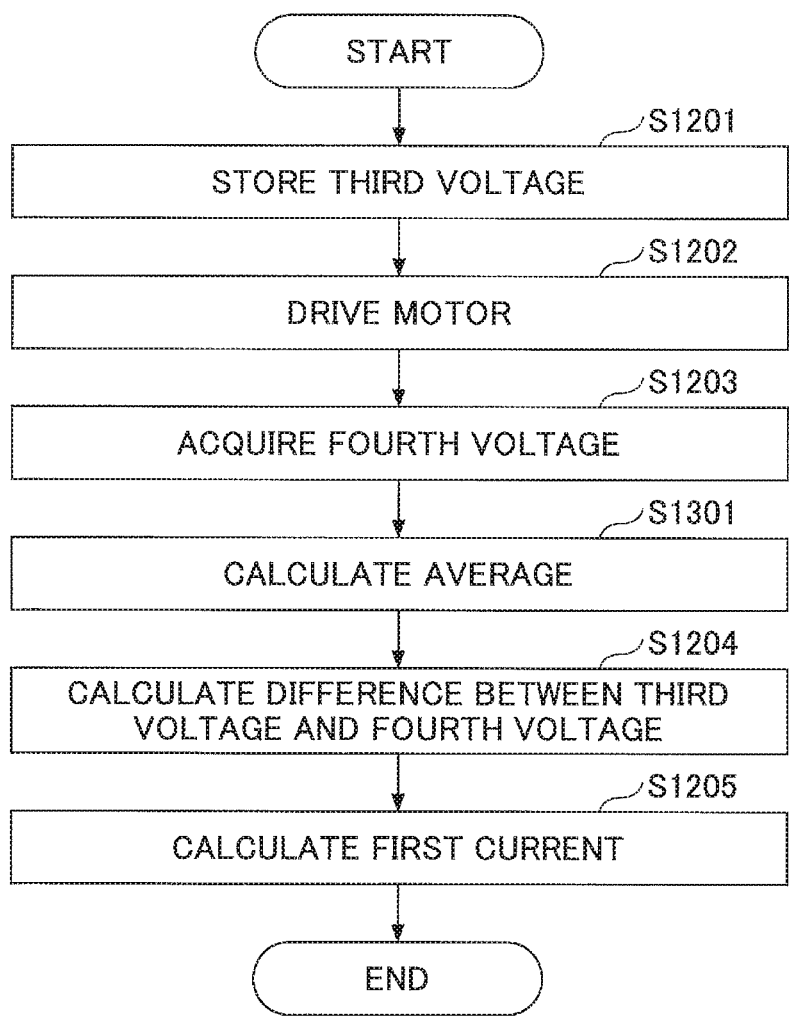
FIG. 13 is a flowchart for illustrating another example of the current measuring process of the first embodiment.

Additionally, the current measuring process may be performed as shown in FIG. 13.

FIG. 13 is a flowchart for illustrating another example of the current measuring process of the present embodiment. In the current measuring process shown in FIG. 13, a process of step S1301 is added, which is different from the current measuring process shown in FIG. 12. In the following, mainly, the difference is described.

In step S1203, in a case where the electric motor is rotating, the acquisition unit 205 acquires a plurality of values of the forth voltage V4 (FIG. 9) indicated by the third signal SIG3 input in the ADC 207. In step S1301, the acquisition unit 205 calculates an average of the acquired voltage values. For example, in step S1203, the acquisition unit 205 performs signal sampling 100 times at a sampling time 1 ms, and thereby calculates the average of the 100 acquired voltage values. In step S1204, the calculation unit 206 calculates the difference by using the calculated average.

When using the average, the calculation unit 206 can calculate the difference with a high precision even when noise, etc., are included in the signal.

<Example Processing Result of Current Measuring Process>

Figure 14:
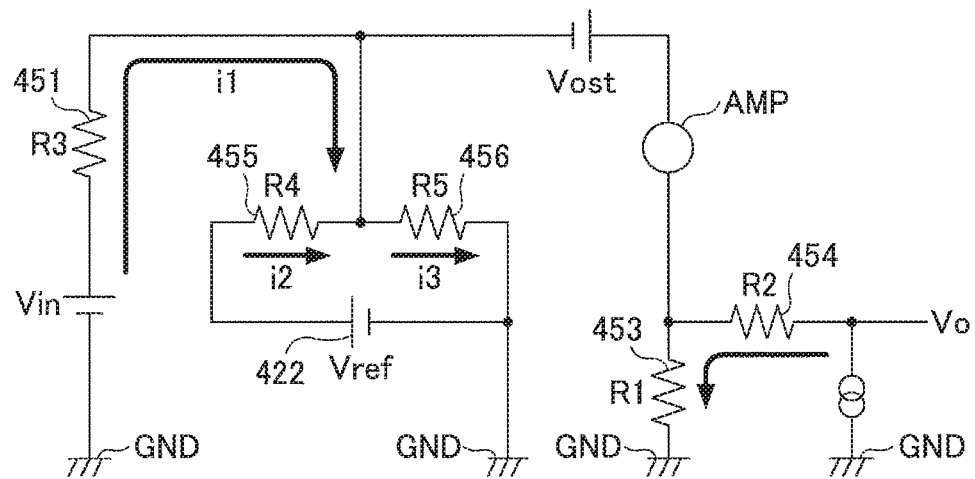
FIG. 14 is a circuit diagram for illustrating an example circuit equivalent to the circuit of the general arrangement of the current measuring apparatus of the first embodiment.

FIG. 14 is a circuit diagram for illustrating an example circuit equivalent to the circuit of the general arrangement of the current measuring apparatus of the present embodiment. That is, FIG. 14 is an example equivalent circuit of the circuit shown in FIG. 11.

In FIG. 14, the first voltage indicated by the first signal is shown as "Vin". Also, a resistance value of a resistor 453 is shown as a first resistance value R1, a resistance value of a resistor 454 is shown as a second resistance value R2, a resistance value of a resistor 451 is shown as a third resistance value R3, a resistance value of a resistor 455 is shown as a fourth resistance value R4, and a resistance value of a resistor 456 is shown as a fifth resistance value R5. Further, the third voltage indicated by the third signal is shown as "Vo", the power supply voltage of the second power supply 422 is shown as "Vref", and the offset voltage of the operational amplifier is shown as "Vost".

In a case where a voltage Vin is detected, that is, in a case where the electric motor is rotating through the process of step S1202, Vo can be expressed by formula (1) shown below, wherein "V1" indicates the second voltage.

[Math. 1]

$$Vo = \left(1 + \frac{R_2}{R_1}\right) \times (V1 + Vost) = \left(1 + \frac{R_2}{R_1}\right) \times \left(\frac{R_4 R_5 Vin + R_2 R_5 Vref}{R_3 R_4 + R_4 R_5 + R_3 R_5} + Vost\right) \quad (1)$$

In a case where the voltage Vin is not detected (Vin=0), that is, in a case where the electric motor is stopped, Voff can be expressed by formula (2) shown below, wherein Voff indicates Vo.

[Math. 2]

$$Voff = \left(1 + \frac{R_2}{R_1}\right) \times \left(\frac{R_3 R_5}{R_3 R_4 + R_4 R_5 + R_3 R_5} \times Vref + Vost\right) \quad (2)$$

That is, "Vo" expressed by formula (1) is the fourth voltage acquired in step S1203. Also, "Voff" expressed by formula (2) is the third voltage stored in step S1201. Therefore, the difference "Von" between the third voltage and the fourth voltage can be calculated, in step S1204, by subtracting formula (2) from formula (1), and can be expressed by formula (3) shown below.

[Math. 3]

$$Von = \left(1 + \frac{R_2}{R_1}\right) \times \frac{R_4 R_5}{R_3 R_4 + R_4 R_5 + R_3 R_5} \times Vin \quad (3)$$

Also, based on formula (3), a gain "G" can be expressed by formula (4) shown below.

[Math. 4]

$$G = \frac{Von}{Vin} = \left(1 + \frac{R_2}{R_1}\right) \times \frac{R_4 R_5}{R_3 R_4 + R_4 R_5 + R_3 R_5} \quad (4)$$

As shown in formula (4), the gain G does not depend on either the offset voltage "Vost" or the power supply voltage "Vref" of the second power supply 422. Therefore, even if the power supply voltage of the second power supply 422 varies, that will not cause the gain G to be varied. Therefore, the calculation unit 206 can eliminate measurement error with a high precision even when the offset voltage of the operational amplifier AMP varies.

Also, the first current I1 calculated in step S1205 can be expressed by formula (5) shown below, wherein "Rf" indicates a resistance value of the shunt resistors 430, and "VADC" indicates a voltage acquired by the ADC 207.

[Math. 5]

$$I1 = \frac{VADC}{\left(1 + \frac{R_2}{R_1}\right) \times \frac{R_4 R_5}{R_3 R_4 + R_4 R_5 + R_3 R_5} \times Rf} \quad (5)$$

In formula (5), a coefficient by which "Rf" in the denominator is multiplied can be calculated based on formula (3). Hence, the calculation unit 206, which has calculated the difference between the third voltage V3 and the fourth voltage V4 in step S1204, can calculate the first current I1.

As indicated by formula (2), "Voff" can be calculated based on the first resistance value R1, the second resistance value R2, the third resistance value R3, the fourth resistance value R4 and the fifth resistance value R5. Meanwhile, the maximum output voltage of the operational amplifier AMP is determined in accordance with the power supply voltage of the second power supply.

For example, in a case where the power supply voltage of the second power supply is 5 V, the operational amplifier AMP can output the voltage of 0 V to 5 V. In this case, "Von" in formula (3) is a voltage of 2 V to 5 V, wherein "Voff" is 2 V. When the value of "Voff" is too large, a resolution performance of the operational amplifier AMP may be degraded since a range of the value of "Von" becomes small. For example, in a case where "Voff" is 4 V, "Von" is a voltage of 4 V to 5 V. Thus, the resolution performance of the operational amplifier AMP is degraded in comparison to a case where "Voff" is 2 V.

Hence, preferably, the value of "Voff" is set to be small. When adjusting the first resistance value R1, the second resistance value R2, the third resistance value R3, the fourth resistance value R4 and the fifth resistance value R5 so as to have a small value of "Voff" expressed in formula (2) and consequently adjusting formula (4), the resolution performance of the operational amplifier AMP is improved.

Additionally, the current measuring apparatus 100 may further include a diode.

Figure 15:
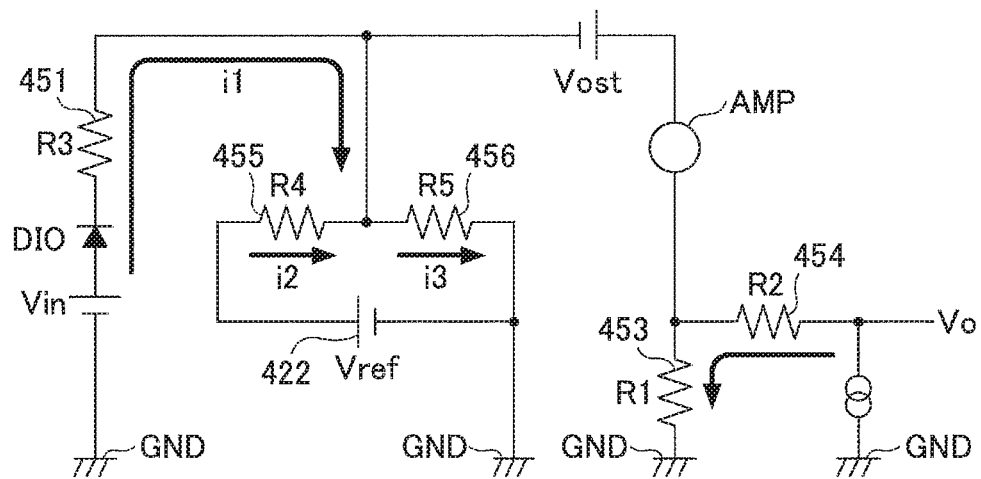
FIG. 15 is a diagram for illustrating an example circuit equivalent to the circuit of the general arrangement of the current measuring apparatus of the first embodiment, in which a diode is included.

FIG. 15 is a diagram for illustrating an example circuit equivalent to the circuit of the general arrangement of the current measuring apparatus of the present embodiment, in which the diode is included. Also, the diode may be disposed as shown in FIG. 16.

Figure 16:
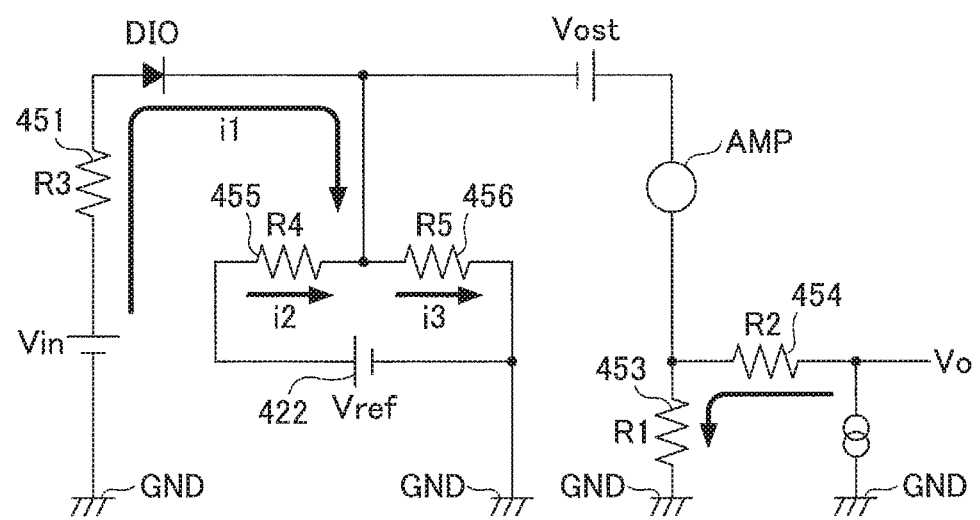
FIG. 16 is a diagram for illustrating another example circuit equivalent to the circuit of the general arrangement of the current measuring apparatus of the first embodiment, in which the diode is included.

FIG. 16 is a diagram for illustrating another example circuit equivalent to the circuit for measuring current of the general arrangement of the present embodiment, in which the diode is included.

As shown in FIG. 15 and FIG. 16, the current measuring apparatus 100 includes a diode DIO, which is different from the circuit shown in FIG. 14. Specifically, in FIG. 15, a cathode of the diode DIO is coupled to the resistor 451. That is, in the circuit shown in FIG. 15, the current is unlikely to flow from the resistor 451 to Vin.

On the other hand, in FIG. 16, the cathode of the diode DIO is coupled to the resistor 455. That is, in the circuit shown in FIG. 16, the current is unlikely to flow from the resistor 455 to the resistor 451.

In a case where the resistors 455 and 456 that are included in the input unit are coupled to a circuit including the second power supply 422 as shown in FIG. 14, the current may flow from the second power supply 422 to Vin. On the other hand, in a case where the diode DIO is disposed between Vin and the resistor 451 as shown in FIG. 15 or between the resistor 455 and the resistor 451 as shown in FIG. 16, the current is unlikely to flow from the second power supply 422 to Vin.

<Summary>

As described above, in the current measuring apparatus 100 of the present embodiment, the detection unit includes the shunt resistor and detects the signal indicating the voltage across the shunt resistor; the smoothing unit performs the smoothing operation on the detected signal indicating the voltage across the shunt resistor, and the smoothed signal is input into the operational amplifier; the input unit adds the second voltage to the voltage input at the operational amplifier; the amplification unit includes an operational amplifier, and amplifies the signal input into the amplifier; the storage unit stores the third voltage indicated by the third signal when the electric motor is stopped; the acquisition unit acquires the fourth voltage indicated by the third signal when the electric motor rotates; and the calculation unit calculates the difference between the third voltage and the fourth voltage, and further calculates the value of the first current based on the calculated difference.

As described above, in the present embodiment, the amplification unit can be achieved with one operational amplifier, so that two or more operational amplifiers are not required. Therefore, the current measuring apparatus of the present embodiment can be achieved at low cost.

Second Embodiment

In the first embodiment, applications of the current measuring apparatus 100 are not defined. For example, the current measuring apparatus 100 of the first embodiment can be applied to an image forming apparatus that includes an electric motor for rotationally driving a roller. The current measuring apparatus 100 may be applied to a vehicle, a robot, an amusement apparatus, and the like.

Figure 17:
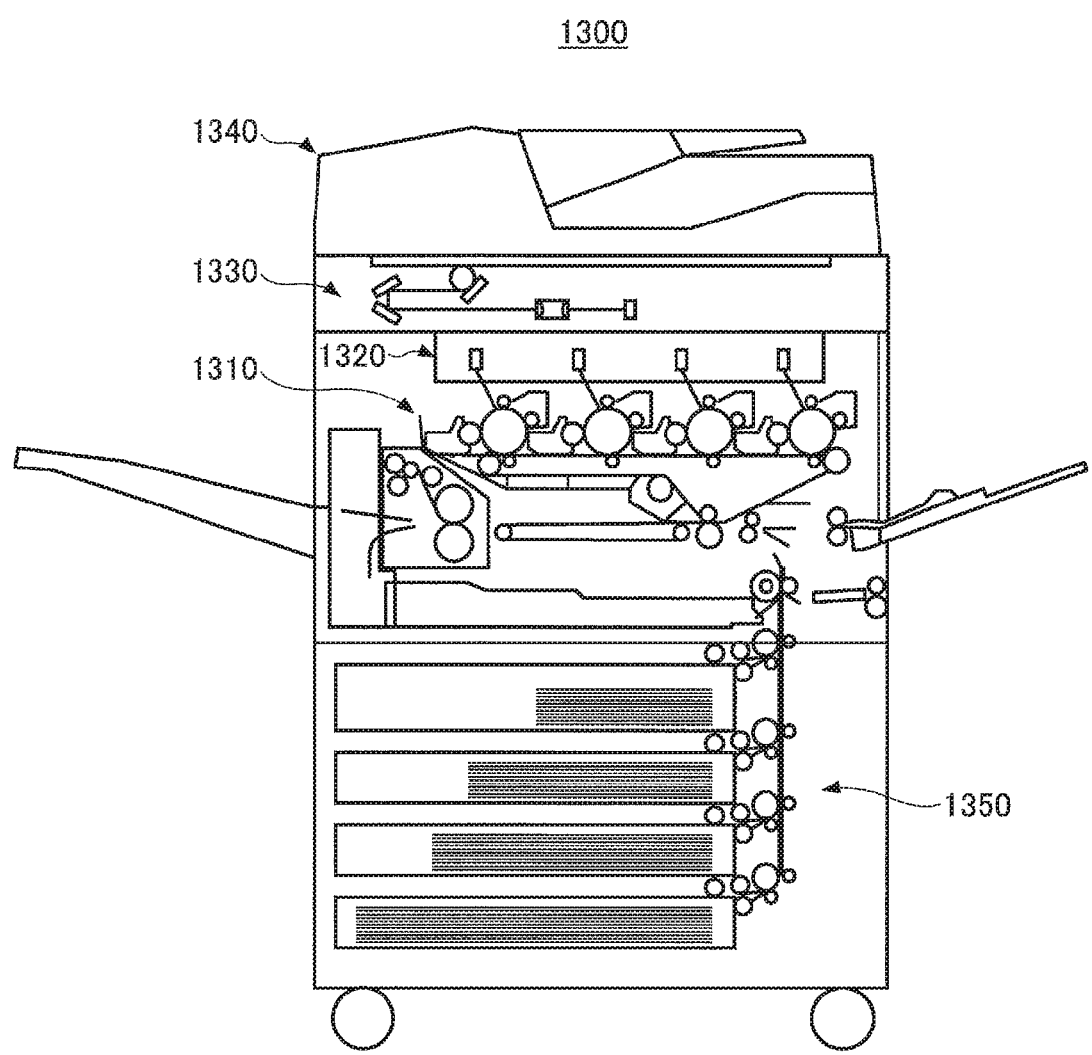
FIG. 17 is a diagram for illustrating an example internal configuration of an image forming apparatus, which is an example application of the current measuring apparatus according to a second embodiment.

FIG. 17 is a diagram for illustrating an example internal configuration of the image forming apparatus, which is an example application of the current measuring apparatus. Specifically, as shown in FIG. 17, the image forming apparatus 1300 includes an intermediate transfer unit 1310, an optical writing unit 1320, a scanner 1330, an automatic document feeder 1340 and a paper feeder 1350.

Figure 18:
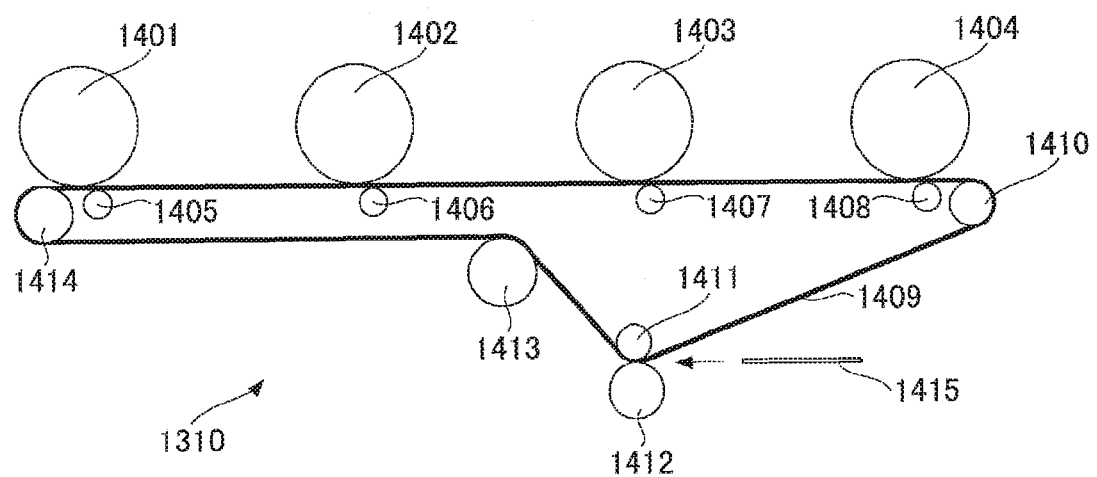
FIG. 18 is an enlarged view of an example drive/conveyance mechanism of an intermediate transfer unit of an image forming apparatus according to the second embodiment.

Also, FIG. 18 is an enlarged view of an example drive/conveyance mechanism of the intermediate transfer unit of the image forming apparatus. Specifically, as shown in FIG. 18, the drive/conveyance mechanism of the intermediate transfer unit 1310 includes an intermediate transfer belt 1409 as an intermediate transfer medium, photoreceptor drums 1401-1404 as image bearers, primary transfer rollers 1405-1408 as primary transfer members and a drive roller 1410. Also, the drive/conveyance mechanism of the intermediate transfer unit 1310 includes a secondary transfer facing roller 1411, a secondary transfer roller 1412, a tension roller 1413, a driven roller 1414, and the like. Additionally, the drive roller 1410 is rotationally driven by an electric motor that serves as a driving unit.

Image abnormality caused by a banding phenomenon, by which periodic or random density unevenness is caused, may be related to the drive/conveyance mechanism of the intermediate transfer unit 1310 included in the image forming apparatus 1300. Especially, in the banding phenomenon, shock jitter, which is caused by shock at a timing when a top end and a tail end of a recording medium 1415 passes through the drive/conveyance mechanism, when two types of drive/conveyance mechanisms are in contact with or separated from each other, etc., causes the density unevenness at a specific timing.

A method is proposed as a countermeasure to the banding phenomenon, in which a variance of rotational speed of the drive roller 1410 is reduced, where the variance of rotational speed is caused by a variance of load torque at a timing when a top end or a tail end of a recording medium 1415 passes through a secondary transfer area. That is, the method enables control for keeping evenness of rotation of the drive roller 1410 even when the load torque varies.

When the current measuring apparatus 100 of the first embodiment is used for controlling the electric motor for rotationally driving the drive roller 1410, the load torque can be estimated with high precision based on the current value. Also, by feeding-back the estimated load torque, the image forming apparatus 1300 can reduce the influence of the variance of the load torque caused by the shock jitter.

Additionally, all of or part of the respective processes may be achieved by a computer readable and executable program described in a legacy programming language including assembler, C, C++, C#, Java, etc., or an object oriented programming language, and the like. That is, the program is a computer readable program for causing a computer such as a current measuring apparatus, an information processing apparatuses, an information processing system including the information processing apparatus, etc., to execute the respective processes.

Also, the program may be stored in a computer readable recording medium such as a ROM, an EEPROM (Electrically Erasable Programmable ROM) to be distributed. Additionally, the recording medium may be an EPROM (Erasable Programmable ROM), a flash memory, a flexible disk, a CD-ROM (Compact Disc-Read Only Memory), a DVD-ROM, a DVD-RAM, a DVD-RW, a Blu-ray disk, a SD card memory, MO, and the like. Further, the program may be distributed through an electronic communication line.

Further, the respective processes may be performed by an information processing system including two or more information processing apparatuses mutually connected through a network, and the like. The information processing system may perform a part of or all of the processes in parallel, separately, or redundantly.

Herein above, although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth. The present application is based on Japanese Priority Application No. 2015-057341 filed on Mar. 20, 2015, the entire contents of which are hereby incorporated herein by reference.

What is claimed is:

1. A current measuring apparatus for measuring a first current flowing in a motor, the first current being used for estimating a load torque of the motor, the current measuring apparatus comprising:
    a detection unit configured to detect a first voltage indicating a second current as a first signal, the second current being composed based on currents of respective phases of the motor;
    a smooth unit configured to perform a smoothing operation on the first signal to generate a second signal;
    an amplification unit including a first input terminal at which the second signal is input, a second input terminal coupled to a first resistor and a second resistor, an amplification factor of the amplification unit being determined by a resistance value of the first resistor and a resistance value of the second resistor, an output terminal for outputting a third signal generated by amplifying the second signal in accordance with the amplification factor, the amplification unit being coupled to a first power supply;
    an input unit configured to input a second voltage at the first input terminal;
    a storage unit configured to store a third voltage indicated by the third signal in response to the motor being stopped;
    an acquisition unit configured to acquire a fourth voltage indicated by the third signal in response to the motor being rotated; and
    a calculation unit configured to calculate the first current based on a difference between the third voltage and the fourth voltage.

2. The current measuring apparatus according to claim 1, wherein the amplification unit is a single-power operational amplifier.

3. The current measuring apparatus according to claim 1, wherein the detection unit includes a shunt resistor for indicating the first voltage.

4. The current measuring apparatus according to claim 3, wherein a terminal of the shunt resistor is coupled to a motor power supply for supplying power to the motor.

5. The current measuring apparatus according to claim 3, wherein a terminal of the shunt resistor is grounded.

6. The current measuring apparatus according to claim 1, wherein
    the smoothing unit includes a third resistor,
    the input unit includes a fourth resistor and a fifth resistor, and
    the calculation unit calculated the difference between the third voltage and the fourth voltage based on respective resistance values of the first resistor, the second resistor, the third resistor, the fourth resistor and the fifth resistor.

7. The current measuring apparatus according to claim 6, wherein
    the fourth resistor includes a first terminal coupled to a second power supply and a second terminal coupled to the first input terminal, and
    the fifth resistor includes a third terminal that is grounded and a fourth terminal coupled to the first input terminal.

8. The current measuring apparatus according to claim 7, wherein the second power supply is the same power supply as the first power supply.

9. The current measuring apparatus according to claim 7, further comprising a diode, a cathode of the diode being coupled to the second terminal.

10. The current measuring apparatus according to claim 7, wherein the third resistor includes a fifth terminal at which the first signal is input and a sixth terminal coupled to the first input terminal.

11. The current measuring apparatus according to claim 10, further comprising a diode, a cathode of the diode being coupled to the fifth terminal.

12. The current measuring apparatus according to claim 6, wherein
    the smoothing unit further includes a capacitor, and
    the smoothing unit attenuates a signal having a frequency greater than or equal to a frequency determined by a resistance value of the third resistor and a capacitance of the capacitor, the signal to be attenuated being included in the first signal.

13. The current measuring apparatus according to claim 1, wherein the acquisition unit acquires a plurality of values of the fourth voltage to calculated an average of the plurality of values of the fourth voltage.

14. A method for measuring current performed by a current measuring apparatus for measuring a first current flowing in a motor, the first current being used for estimating a load torque of the motor, the current measuring apparatus including a detection unit configured to detect a first voltage indicating a second current as a first signal, the second current being composed based on currents of respective phases of the motor, a smoothing unit configured to perform a smoothing operation on the first signal to generate a second signal, an amplification unit including a first input terminal at which the second signal in input, a second input terminal coupled to a first resistor and a second resistor, an amplification factor of the amplification unit being determined by a resistance value of the first resistor and a resistance value of the second resistor, an output terminal for outputting a third signal generated by amplifying the second signal in accordance with the amplification factor, the amplification unit being coupled to a first power supply, and an input unit configured to input a second voltage at the first input terminal, the method comprising:
    storing a third voltage indicated by the third signal in response to the motor being stopped;
    acquiring a fourth voltage indicated by the third signal in response to the motor being rotated; and
    calculating the first current based on a difference between the third voltage and the fourth voltage.

15. A current measuring apparatus comprising:
    A current measuring apparatus for measuring a first current flowing in a motor, the first current being used for estimating a load torque of the motor, the current measuring apparatus comprising:
    a detection circuit configured to detect a first voltage indicating a second current as a first signal, the second current being composed based on currents of respective phases of the motor;

a smooth circuit configured to perform a smoothing operation on the first signal to generate a second signal;

an amplification circuit configured to receive the second signal at an input terminal of the amplification circuit and output a third signal by amplifying the second signal, the amplifying circuit being coupled to a first power supply;

an input circuit configured to input a second voltage at the input terminal of the amplification circuit;

a storage unit configured to store a third voltage indicated by the third signal in response to the motor being stopped;

an acquisition unit configured to acquire a fourth voltage indicated by the third signal in response to the motor being rotated; and a calculation unit configured to calculate the first current based on a difference between the third voltage and the fourth voltage.

* * * * *